United States Patent
Liu et al.

(10) Patent No.: US 7,338,817 B2
(45) Date of Patent: Mar. 4, 2008

(54) BODY BIAS COMPENSATION FOR AGED TRANSISTORS

(75) Inventors: Jonathan H. Liu, Folsom, CA (US); Wonjae L. Kang, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 390 days.

(21) Appl. No.: 11/096,777

(22) Filed: Mar. 31, 2005

(65) Prior Publication Data

US 2006/0223201 A1 Oct. 5, 2006

(51) Int. Cl.
*H01L 21/00* (2006.01)

(52) U.S. Cl. .............................. 438/10; 438/12; 438/14; 438/17

(58) Field of Classification Search .................. 438/10, 438/11, 12, 14, 17, 18; 324/763, 765, 769
See application file for complete search history.

(56) References Cited

U.S. PATENT DOCUMENTS

| | | | |
|---|---|---|---|
| 6,535,013 B2 | 3/2003 | Samaan | |
| 6,597,218 B1 * | 7/2003 | Gauthier et al. | 331/DIG. 2 |
| 6,724,268 B2 | 4/2004 | Takahashi | |
| 6,778,024 B2 * | 8/2004 | Gupta et al. | 331/16 |
| 6,903,564 B1 | 6/2005 | Suzuki | |
| 7,129,800 B2 * | 10/2006 | Gauthier et al. | 331/175 |
| 2005/0134394 A1 | 6/2005 | Liu | |
| 2005/0140418 A1 | 6/2005 | Muniandy et al. | |

OTHER PUBLICATIONS

U.S. Appl. No. 11/096,777, filed Mar. 31, 2005, Liu et al.
Office Action mailed Apr. 18, 2006 for co-pending application No. 10/745,427.

* cited by examiner

*Primary Examiner*—Kevin M. Picardat
(74) *Attorney, Agent, or Firm*—Blakely, Sokoloff, Taylor & Zafman LLP

(57) ABSTRACT

Embodiments of the invention include on-chip transistor degradation detection and compensation. In one embodiment of the invention, an integrated circuit is provided including a circuit with a body bias terminal coupled to a body of one or more transistors to receive a body bias voltage; a programmable degradation monitor to detect aging of transistors, and a body bias voltage generator coupled to the circuit and the programmable degradation monitor. The body bias voltage generator to adjust the body bias voltage coupled into the circuit in response to transistor aging detected by the programmable degradation monitor. The programmable degradation monitor includes a reference ring oscillator, an aged ring oscillator, and a comparison circuit. The comparison circuit to compare data delays in the reference ring oscillator and the aged ring oscillator to detect transistor aging within the integrated circuit.

6 Claims, 10 Drawing Sheets

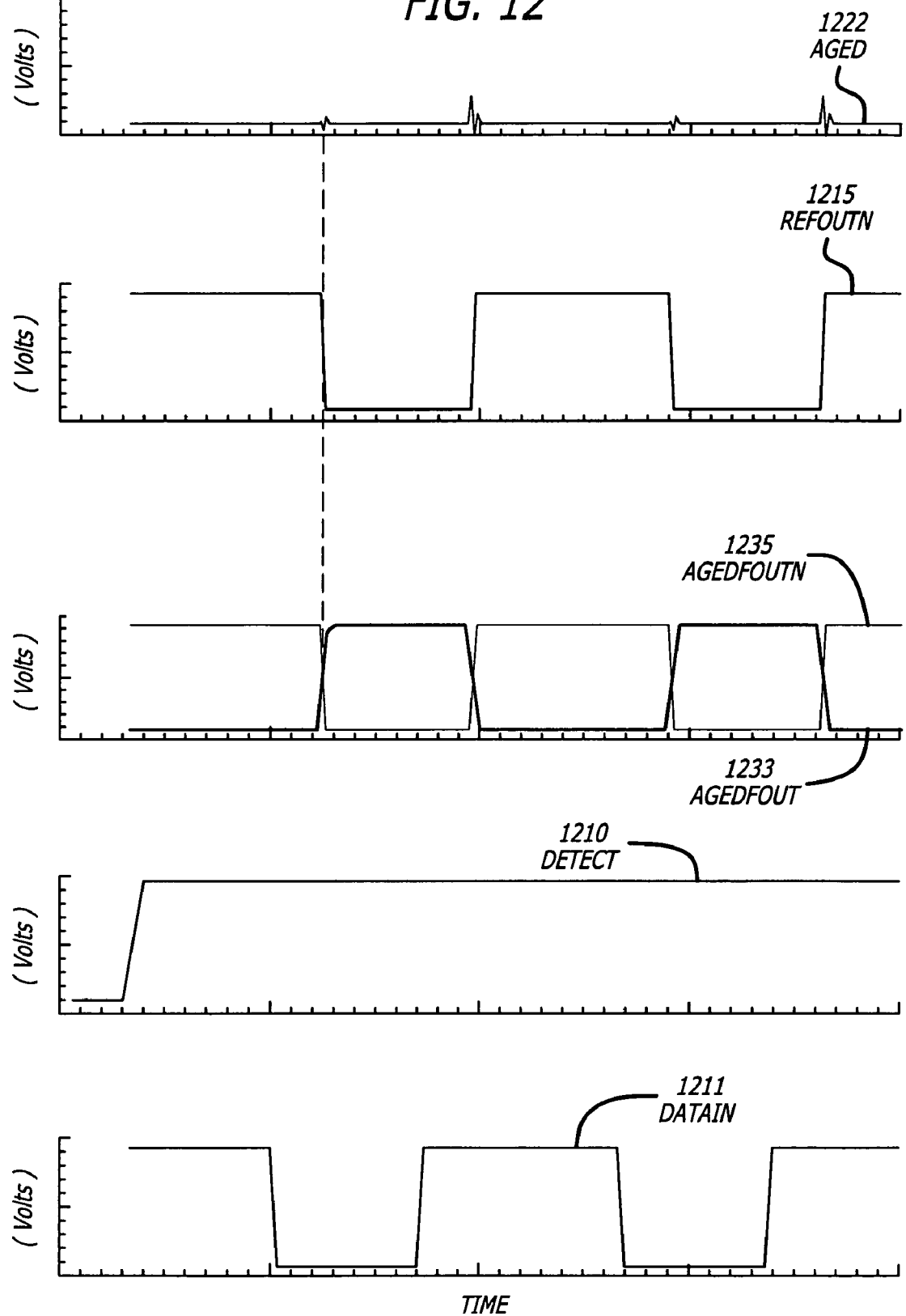

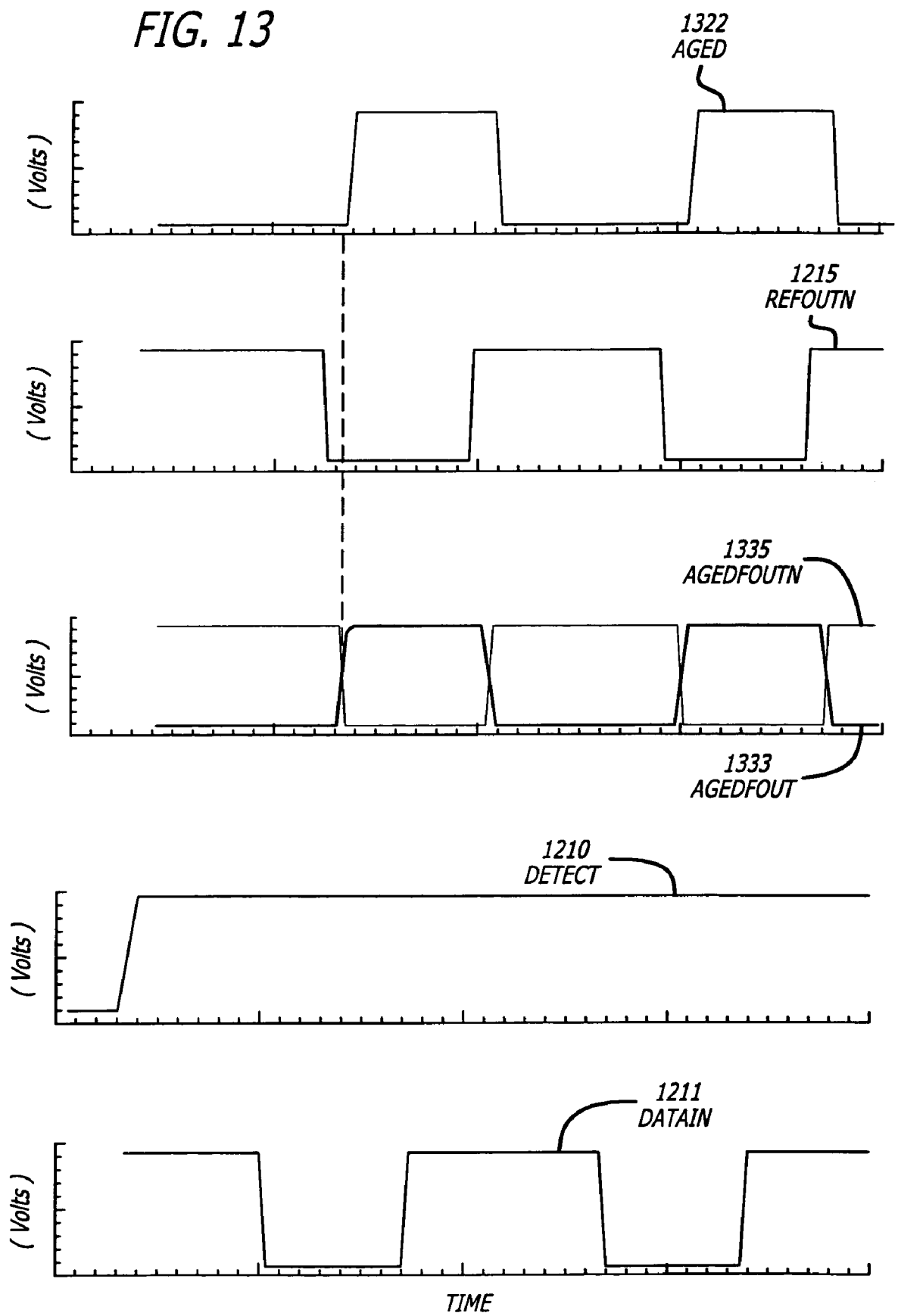

BODY BIAS COMPENSATION FOR AGED TRANSISTORS

FIELD

Embodiments of the invention relate generally to on-chip characterization of transistor degradation and more specifically to the compensation of transistor aging/degradation.

BACKGROUND

As p-channel and n-channel field effect transistors in complementary metal oxide semiconductor integrated circuits have been scaled down, reliability problems with these transistors have increased.

In n-channel field effect transistors (NFETs) as the channel lengths have decreased, transistor degradation, sometimes referred to as a hot-electron effect, has become a greater problem. The hot-electron effect has been studied for quite some time now. Power supplies were accordingly reduced as the transistors were scaled down in order to minimize the hot-electron effect. Designers can design around this somewhat by increasing the channel length of a transistor or increase signal slew rates. For example, the channel lengths of certain transistors that may experience greater stress, such as output drivers, may be increased over that of the minimum channel lengths, in order to decrease the hot electron effect.

In the p-channel field effect transistors (PFETs), a new transistor degradation has more recently been discovered. This phenomenon is sometimes referred to as "negative bias temperature instability" (NBTI) but may more commonly be referred to as PMOS BT (p-channel metal oxide semiconductor field effect transistor ("PMOS") bias temperature) or PBT as it causes the turn on threshold (Vth) of the PFET to shift (an increase in the absolute value) and degrades drain current when devices are biased in inversion. Thus the strength of active PFETs in an integrated circuit will degrade accumulatively over the product life time.

In order to ascertain whether integrated circuit designs and semiconductor processes can withstand these transistor degrading effects, integrated circuits are put through quality assurance and reliability testing.

Typical quality assurance and reliability testing for integrated circuits "burn-in" or runs the functional device for extended periods of time in hot ovens at higher voltages and then test or characterize the functionality of the integrated circuit over the corners of the power supply, operating temperature, and clock speed to see if it still functions. However, "burn-in" is not actually how an integrated circuit is used in a system. The integrated circuit experiences other conditions such as power cycling, large temperature variations, and even physical vibration while in use.

In other cases, dedicated test integrated circuits are used to determine the quality assurance and the reliability of a given semiconductor process. These dedicated test integrated circuits that provide characterization information, have little to no functionality and are typically designed for experimental testing only. In order to obtain a measure of the quality assurance and the reliability, the dedicated test integrated circuit may be similarly "burned-in" and then tested or characterized over the corners of the power supply and operating temperature. In this case measurements are taken to try and determine the reliability and quality of a process and a design. But again, this is not actually how an integrated circuit is used in a system.

BRIEF DESCRIPTION OF THE DRAWINGS

FIG. 12 is a waveform diagram illustrating the functionality of the programmable degradation monitor in a new or fresh state.

FIG. 13 is a waveform diagram illustrating the functionality of the programmable degradation monitor in an aged state.

DETAILED DESCRIPTION

Figure 1:
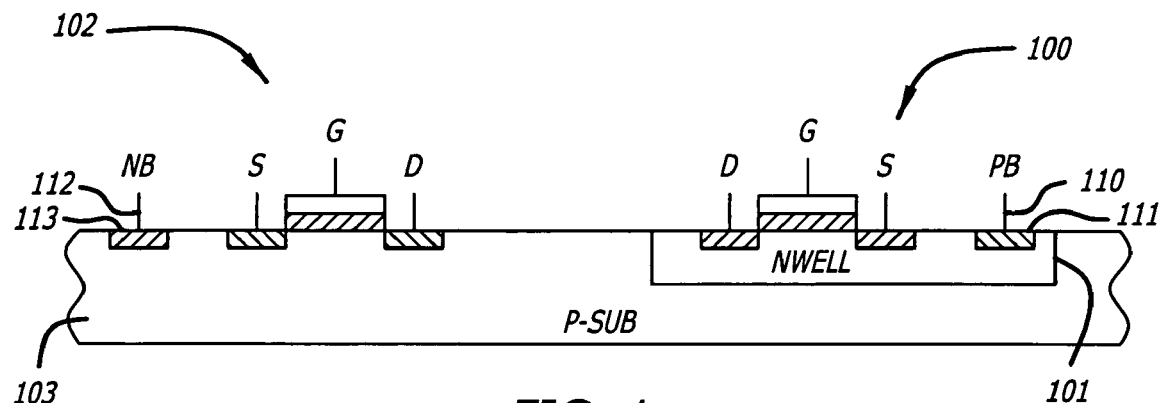
FIG. 1 illustrates a cross section of an integrated circuit including a P channel transistor and an N channel transistor.

In the following detailed description of embodiments of the invention, numerous specific details are set forth in order to provide a thorough understanding of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

Note that references to p-channel transistor and n-channel transistor are used herein to refer to transistor switches that maybe formed out of p-channel field effect transistors (PFET or PMOS) and n-channel field effect transistors (NFET or NMOS) respectively. Also note that the channel widths and lengths of the transistors may be modified as desired.

There are two known significant transistor degradation mechanisms that affect circuit performance. These significant transistor degradation mechanisms are PMOS BT transistor degradation and NMOS hot electron transistor degradation. An integrated on-chip characterization or monitoring circuit is used to quantify these two transistor degradation or aging effects. The on-chip characterization or monitoring circuit is integrated onto the same monolithic die or substrate as the functional blocks of the integrated circuit. In this manner, some circuits of the on-chip characterization or monitoring circuit experience the same stresses of the functional blocks within a system.

To separately quantify these two transistors aging effects, one or more pairs of ring oscillators or data paths may be used to monitor the transistor degradation. One pair of ring oscillators may be designed to obtain the amount of PMOS BT transistor degradation. Another pair of the ring oscillators may be designed to obtain the amount of NMOS hot electron transistor degradation in conjunction with PMOS BT transistor degradation. Subtraction of one value from the other may be used to obtain the amount of NMOS hot electron transistor degradation. A single pair of ring oscillators may be used to obtain the amount of NMOS hot electron transistor degradation in conjunction with PMOS BT transistor degradation. In some cases, PMOS BT transistor degradation is the dominating transistor degradation mechanism so that NMOS hot electron transistor degradation can be ignored or estimated.

The levels of PMOS BT and hot electron transistor degradation determined by the on-chip characterization or monitoring circuit may be used to quantify maximum frequency (Fmax) clock degradation of an integrated circuit and the risks of special circuits found therein. The levels of PMOS BT and hot electron transistor degradation may also be used to calibrate aging parameters and models in various aging simulators to provide better correlation to the actual silicon when analyzing speed path aging and design fixes thereto. By detecting PMOS BT and/or hot electron transistor degradation on chip, compensation may be made by varying a body bias voltage applied to transistors so that performance in aged circuitry is improved up to that of non-aged circuitry.

Embodiments of the invention include methods and apparatuses to monitor or characterize amounts of transistor degradation, accumulated during the lifetime of a semiconductor device. Pairs of ring oscillators with substantially similar transistor networks or circuits are provided. One of the ring oscillators of the pairs is enabled when the integrated circuits are powered on so that it is under stress during the lifetime of the integrated circuit. The other one of the ring oscillators of the pairs is only enabled when a measure of the transistor degradation is taken, and otherwise, is "specially biased" so that it is not under stress during the lifetime of the integrated circuit.

These specially biased or selectively enabled ring oscillators provide a reference ring oscillation output to compare with a degraded or aged ring oscillation output. In these specially biased ring oscillators, the transistors will not degrade or age as they are disabled and unbiased during a substantial portion of their lifetimes. Thus, these specially biased ring oscillators provide a "fresh" reference output for each integrated circuit to which they are integrated on-chip.

Embodiments of the invention enable characterization and compensation of P-channel transistor degradation in an integrated circuit.

In one embodiment of the invention, the data delay between a stressed and an unstressed ring oscillator is compared to detect if transistor level device degradation has occurred. If so, compensation is provided by way of altering the body bias voltage applied to P-channel transistors in circuitry. By adjusting the back side bias voltage applied to a PMOS device, the body effect can increase the PMOS device performance. The PMOS devices typically reside in N-wells over a substrate on an integrated circuit. Forward biasing the N-well to 0.4V below the source voltage of the PMOS device, the performance of circuits in a typical combinatorial speed path may be improved by approximately five percent. This percentage is greater than a frequency guard band that may be typically used in today's production tests for integrated circuits. Compensating for p-channel transistor degradation enables an integrated circuit to maintain its performance over a substantial part of its lifetime. Biasing the N-well to compensate for transistor degradation is particularly useful in speed critical circuit blocks.

In alternate embodiments of the invention the circuit power voltage level can be adjusted upward, increasing the voltage applied to the circuits in order to compensate for an amount of degradation. Circuit power voltage level may be adjusted upward by adjusting a voltage identification (VID) code specifying the power supply voltage level or by adjusting upward the voltage provided by an on-chip voltage regulator.

In one embodiment of the invention, an integrated circuit is provided including a circuit with a body bias terminal coupled to a body of one or more transistors to receive a body bias voltage; a programmable degradation monitor to detect aging of transistors, and a body bias voltage generator coupled to the circuit and the programmable degradation monitor. The body bias voltage generator to adjust the body bias voltage coupled into the circuit in response to transistor aging detected by the programmable degradation monitor. The programmable degradation monitor includes a reference ring oscillator, an aged ring oscillator, and a comparison circuit. The comparison circuit to compare data delays in the reference ring oscillator and the aged ring oscillator to detect transistor aging within the integrated circuit.

In another embodiment of the invention, a method is provided that includes applying a data signal to a first ring oscillator and a second ring oscillator; comparing a first delay in the data signal in the first ring oscillator with a second delay in the data signal in the second ring oscillator to detect transistor degradation; and adjusting a body bias to transistors in the integrated circuit to compensate for transistor degradation in response to the comparing detecting transistor degradation. The method may further include enabling the first ring oscillator to age transistors therein prior to applying the data signal.

In yet another embodiment of the invention, a programmable degradation monitor is provided including a reference ring oscillator, a degradable ring oscillator, and a comparison circuit. The reference ring oscillator provides a reference frequency signal and a reference delay signal in response to a data input signal. The degradable ring oscillator provides an aged frequency signal and an aged delay signal in response to the data input signal. The comparison circuit is coupled to the reference ring oscillator and the degradable ring oscillator to compare the reference delay signal with the aged delay signal to detect transistor aging within an integrated circuit.

In still another embodiment, of the invention, a system is provided including an integrated circuit and a body bias voltage generator coupled to the integrated circuit. The integrated circuit includes a fast circuit with one or more transistors having a body bias terminal to receive a body bias voltage and a source terminal to receive a power supply voltage, and a programmable degradation monitor to detect degradation of transistors. The programmable degradation monitor includes a reference ring oscillator, a degradable ring oscillator, and a comparison circuit. The comparison circuit compares data delay in the reference ring oscillator and the degradable ring oscillator to detect transistor degradation within the integrated circuit. The body bias voltage generator is coupled to the fast circuit and the programmable degradation monitor of the integrated circuit. The body bias voltage generator adjusts either the body bias voltage or the power supply voltage coupled into the transistors of the fast circuit in response to transistor degradation detected by the programmable degradation monitor.

Referring now to FIG. 1, a monolithic integrated circuit chip 100 is illustrated as one embodiment of the invention. The integrated circuit 100 includes on-chip characterization circuitry 102 and one or more functional circuits 104. The on-chip characterization circuitry 102 includes transistor degradation monitors that may be used to calibrate aging parameters to correlate the actual silicon with simulation in order to perform better speed path aging analysis and develop fixes that are two. The integrated circuit 100 further includes on-chip body bias compensation circuitry 106 to compensate for the transistor aging. As discussed further below, the integrated circuit 100 may further include one or more functional blocks, such as an execution unit for example, and in which case the integrated circuit maybe a microprocessor integrated circuit.

In FIG. 1, the p-channel transistor 100 resides in the N-well 101. The N-well 101 resides in the p-minus (p−) substrate 103. The n-channel transistor 102 also resides in the p-minus (p−) substrate 103. Each of the transistors 100 and 102 includes a source s, a gate g, and a drain d.

The n-channel transistor 102 includes an n-channel body NB 112. The p-channel transistor 100 includes an p-channel body PB 110. The n-channel body NB 112 includes a diffusion 113 coupled to the p-minus (p−) substrate 103. The diffusion 113 is a P plus diffusion to couple to the p-minus (p−) substrate 103. The p-channel body PB 110 is coupled to the diffusion 111 within the N-well 101. The diffusion 111 is an n-plus (n+) diffusion to couple to the N-well 101.

Figure 2A:
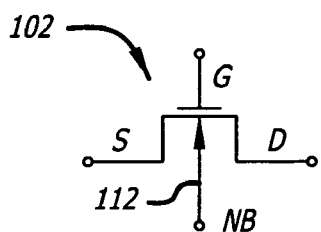
FIG. 2A illustrates a schematic symbol an N channel transistor.

FIG. 2A illustrates the n channel transistor schematic symbol. The n-channel transistor includes a source S, a drain d, and a gate g, and an N-body NB 112.

Figure 2B:
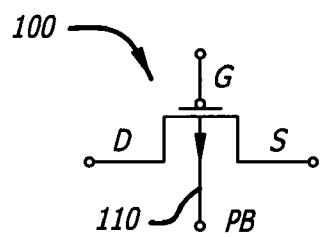
FIG. 2B illustrates a schematic symbol for a P channel transistor.

FIG. 2B illustrates the p-channel transistors schematic symbol. The p-channel transistor includes a source S, a drain D, and a gate G, and P-body PB 110.

The P-body and N-body connections to the p-channel and n-channel transistors respectively may be used to alter the threshold voltages of the transistors and obtain higher drain saturation currents. That is using the P-body and N-body connections, the performance of the p-channel and n-channel transistors maybe improved by altering the bias voltage applied to the respective connections.

Figure 3:
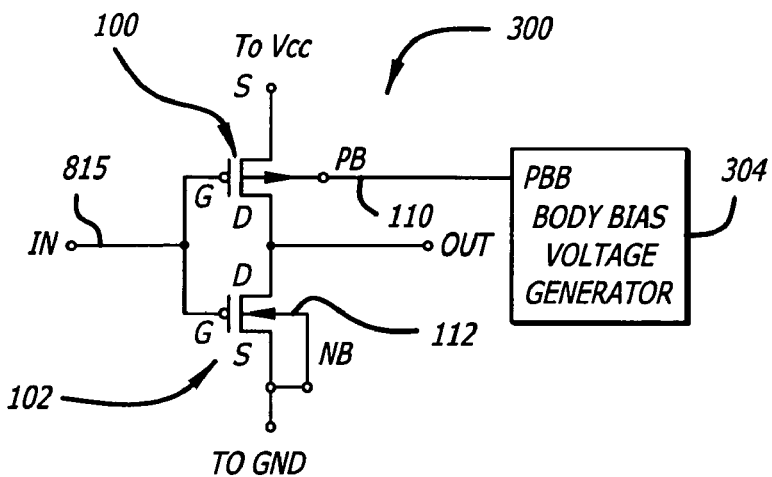
FIG. 3 illustrates a schematic diagram of an inverter coupled to a body bias voltage generator.

Referring now to FIG. 3, an inverter coupled to a body bias voltage generator 304 is illustrated. The gates of the p-channel transistor 100 and the n-channel transistor 102 are coupled together to the input terminal. The drains of the p-channel transistor 100 and n-channel transistor 112 are coupled together to the input terminal.

The P-body terminal PB 110 of the p-channel transistor 100 is coupled to the body bias voltage generator 304. The N-body terminal NB 112 is coupled to the source terminal S of the n-channel transistor 102. The N-body terminal and the source terminal of the n-channel transistor 102 may couple to the negative power supply voltage (ground or VSS) or a selectively enabled ground or VSS. The source terminal of the p-channel transistor 100 maybe coupled to the positive power supply voltage VCC or a selectively enabled VCC.

The body bias generator 304 generates a P-body bias voltage PBB that is coupled to the P-body connection 110 of the p-channel transistor 100. By selectively controlling the body bias voltage generator 304, the P-body bias voltage PBB 110 can alter the performance of the p-channel transistor 100. As discussed further below, it will be shown that altering the P-body bias voltage can improve the performance of the p-channel transistor 100 in order to compensate for p-channel transistor degradation.

Figure 4A:
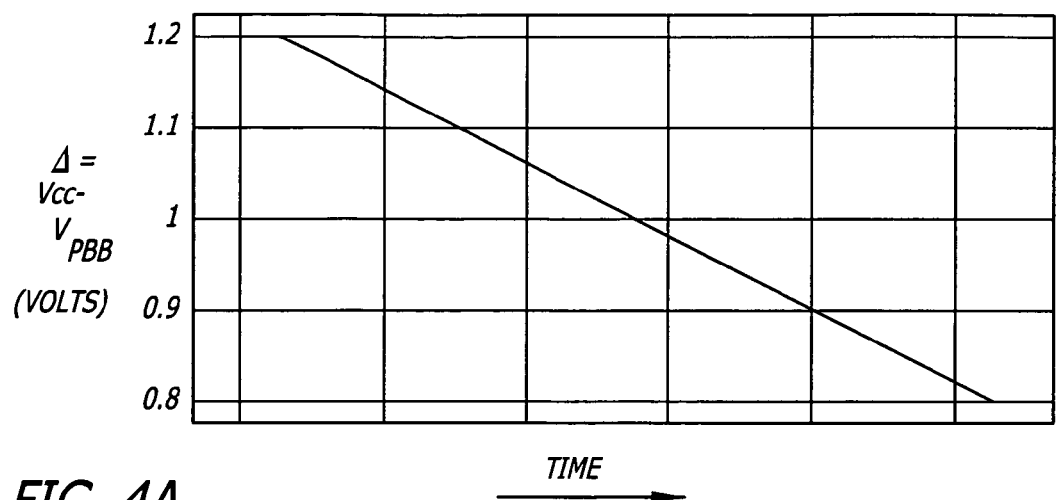
FIGS. 4A-4C are waveform diagrams illustrating the improvement in threshold voltage and saturation current for a reduction in body bias of a P channel transistor over time.
Figure 4B:
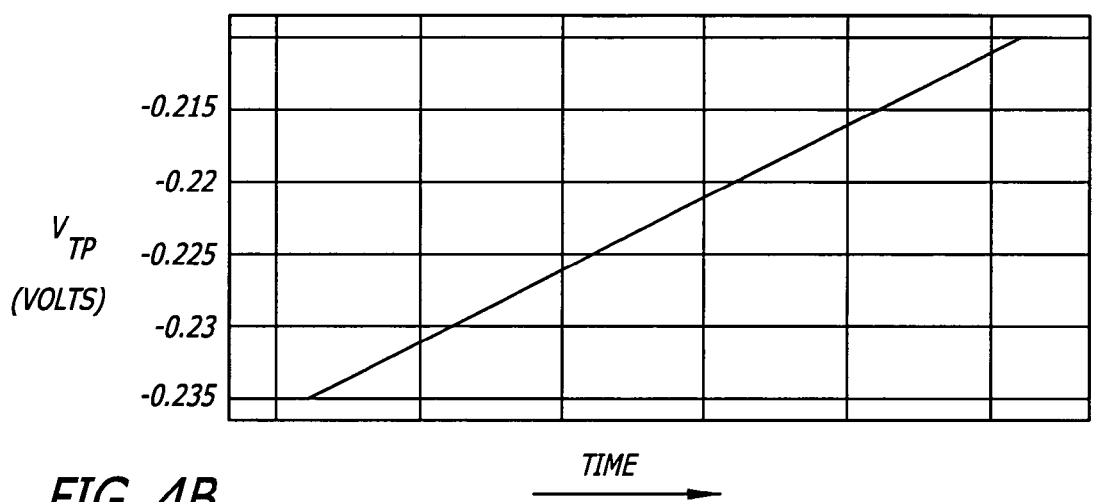
Figure 4C:
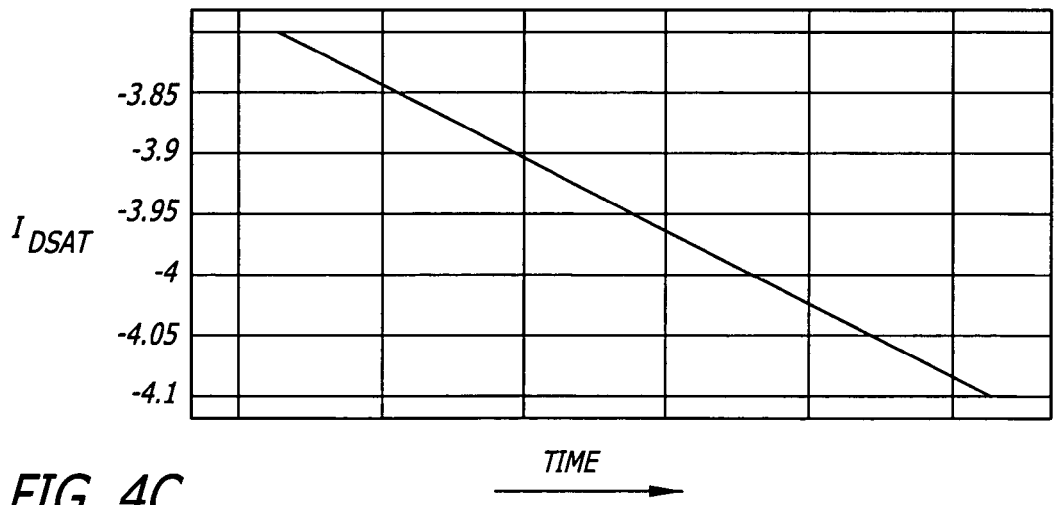

Referring now to FIGS. 4A-4C, waveform diagrams illustrate the improvement in threshold voltage and saturation current when a reduction in the body bias applied to the p-channel transistor occurs over time.

In FIG. 4A, the Y axis represents the difference between the positive power supply voltage VCC and the body bias voltage VPBB (VCC-VPBB). The X axis indicates time. Over a period of 100 nano-seconds, the body bias voltage is altered such that this difference is reduced by about four hundred millivolts. That is, the waveform illustrated in FIG. 4A shows the body bias voltage VPBB increasing relative to VCC. Typically, the P-body terminal 110 is coupled to the source terminal of the p-channel transistor 100 and the positive power supply voltage VCC. Instead, the body voltage is being altered to change the performance of the p-channel transistor.

The waveforms illustrated in FIGS. 4B and 4C correspond in time with that of the waveform of FIG. 4A.

In FIG. 4B, the Y axis indicates the threshold voltage VTP of the p-channel transistor 100 in volts. The threshold voltage VTP of the p-channel transistor 100 is being reduced from approximately negative 240 millivolts to about negative 210 millivolts in response to an increase in the body bias voltage shown in FIG. 4A. That is, its magnitude is being reduced. The reduction in the threshold voltage of the p-channel transistor 100 can improve its performance. This is because the drain current is a function of the threshold voltage of the p-channel transistor.

In FIG. 4C, the Y axis indicates the drain saturation current IDSAT of the p-channel transistor 100. The magnitude of the saturation current increases corresponding to the decrease in the threshold voltage of the p-channel transistor illustrated in the waveform of FIG. 4B. The magnitude of the saturation current increases from approximately 3.8 milliamperes to approximately 4.1 milliamperes. Thus, by altering the body bias voltage, the performance of the p-channel transistor 100 can be improved.

Figure 5A:
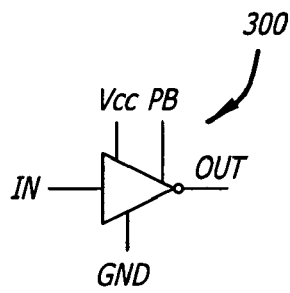
FIG. 5A is a schematic symbol of an inverter with power, ground, and P channel transistor body bias connections.
Figure 5B:
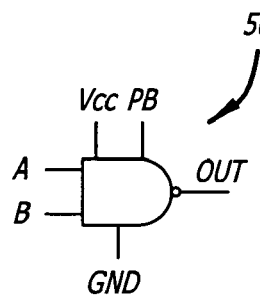
FIG. 5B is a schematic symbol of a NAND gate with power, ground, and P channel transistor body bias connections.
Figure 5C:
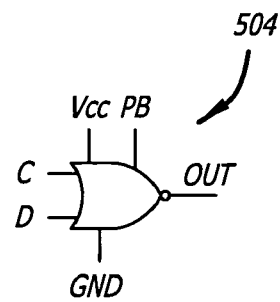
FIG. 5C is a schematic symbol of a NOR gate with power, ground, and P channel transistor body bias connections.

Referring now to FIGS. 5A-5C, various schematic diagram symbols are illustrated for logic gates. The logic gates illustrated in FIGS. 5A-5C include power and ground connections (VCC and GND, respectively) as well as the body bias voltage connection PB. The basic logic gates illustrated in FIGS. 5A-5C may be used to generate more complicated circuitry within the functional blocks of an integrated circuit as is described below.

FIG. 5A illustrates a schematic diagram symbol of an inverter 300 corresponding to that of the inverter 300 in FIG. 3 illustrated using transistor symbols. However, FIG. 5A does not illustrate the body bias voltage generator 304 coupled to the Inverter 300. The schematic symbol of the inverter 300 illustrated in FIG. 5A is used throughout this detailed description of the embodiments of the invention.

Other logic gates may be formed to include the body bias voltage terminal PB in order to provide the bias voltage to the bodies of their respective p-channel transistors. In FIG. 5B, a NAND gate is illustrated having the body of its p-channel transistors coupled to the p-channel terminal PB. In FIG. 5C, a NOR gate is illustrated having the body of its p-channel transistors coupled to the p-channel terminal PB.

Figure 6A:
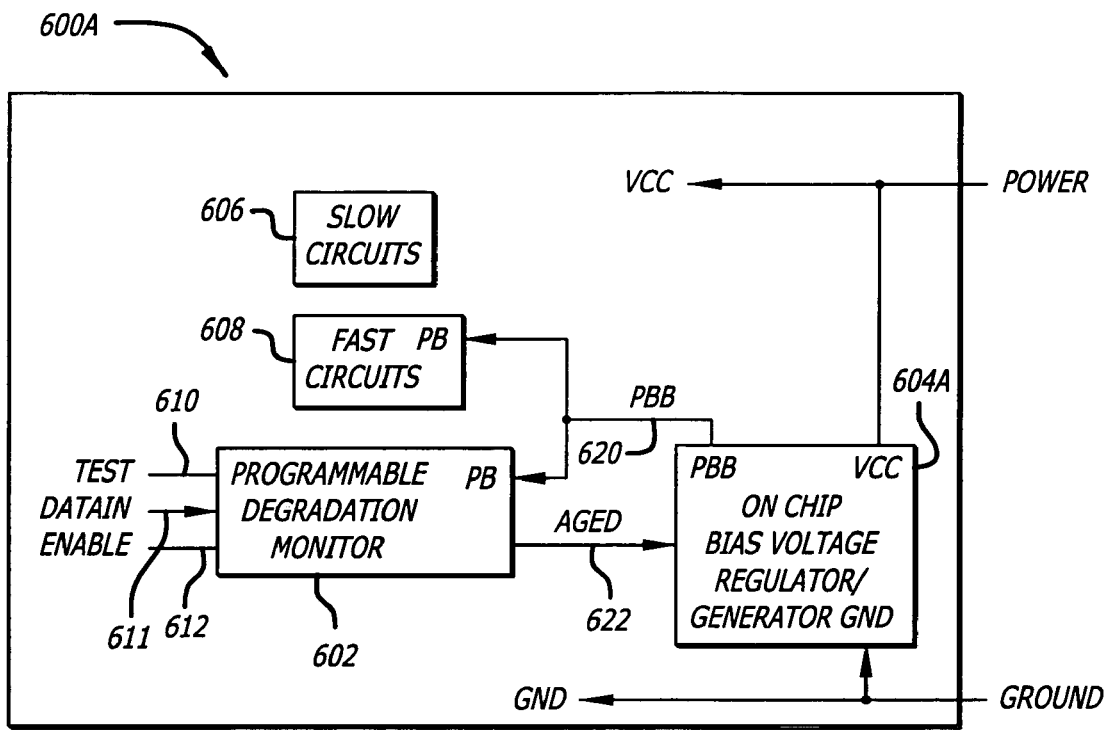
FIG. 6A is a block diagram of a system including an integrated circuit with a programmable degradation monitor and on-chip bias voltage regulator/generator.

Referring now to FIG. 6A, a block diagram of an integrated circuit 600A is illustrated. Integrated circuit 600A includes a programmable degradation monitor 602, an on-chip bias voltage regulator/generator 604A, slow circuits 606, and fast circuits 608. The fast circuits 606 may have little timing margin in their data paths in comparison with a clock cycle. In contrast, the slow circuits 606 may have lots of timing margin with data paths having little delay in comparison with a clock cycle. The programmable degradation monitor 602 and the fast circuits 608 include p-channel body terminals PB coupled to the P-body bias terminal PBB 620 of the on-chip bias voltage regulator/generator 604A. Thus, some of the p-channel transistors of the fast circuits 608 and some of the p-channel transistors of the programmable degradation monitor receive the P-body bias voltage. The slow circuits 606 do not need to have their degradation compensated and thus do not have a p-channel body bias terminal PB to couple to the P-body bias terminal PBB 620 of the on-chip bias voltage regulator/generator 604A. Thus, p-channel transistors of the slow circuits 606 do not receive the P-body bias voltage.

The programmable degradation monitor 602 generates an aged detection signal 622 that is coupled into the on-chip bias voltage regulator/generator 604A. In response to the aged detection signal 622, the on chip bias voltage regulator/generator may alter the P-body bias voltage on the P-body bias terminal PBB 620 in order to compensate for transistor degradation and improve the performance of the fast circuits 608 in one embodiment of the invention. In another embodiment of the invention, the on chip bias voltage regulator/generator may alter the regulation of the positive power provided to the internal circuitry while maintaining the P-body bias voltage on the P-body bias terminal PBB 620 constant in order to compensate for transistor degradation.

Power or a positive power supply voltage is coupled into the VCC terminal of the integrated circuit 600A. Ground or a negative power supply voltage is coupled into the VSS or GND terminal of the integrated circuit 600A. The power supply provided by the power and ground is coupled into the circuitry of the integrated circuits. The on-chip bias voltage regulator/generator 604A couples to the power and ground provided by a power supply (not shown) in order to generate and regulate the P-body bias voltage on the P-body bias terminal PBB 620. In another embodiment of the invention, the on-chip bias voltage regulator/generator 604A also internally regulates the power provided to the internal circuitry from the external power supply.

Figure 6B:
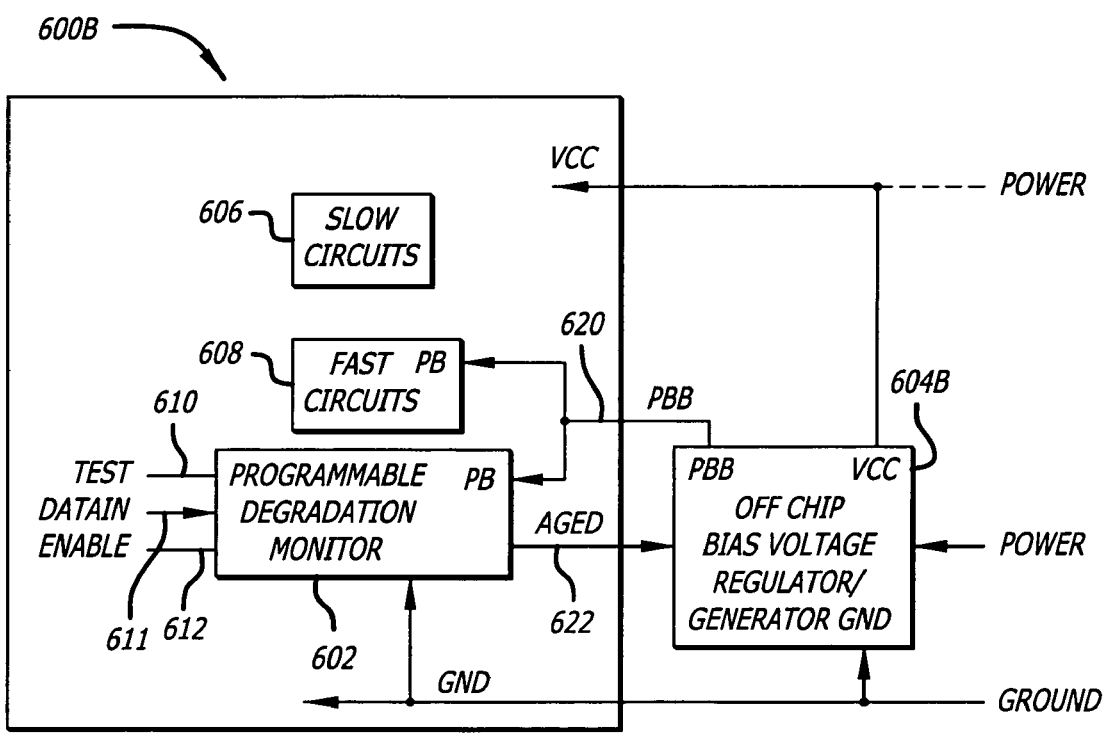
FIG. 6B is a block diagram of a system including an integrated circuit with a programmable degradation monitor coupled to an off-chip bias voltage regulator/generator.

Referring now to FIG. 6B a block diagram of an integrated circuit 600B coupled to an off chip bias voltage regulator/generator 604B is illustrated.

The integrated circuit 600B differs from the integrated 600A illustrated in FIG. 6A in that the bias voltage regulator/generator is off chip and not on chip. That is, the off chip bias voltage regulator/generator 604B is included as a part of a system on a printed circuit board with the integrated circuit 600B. Integrated circuit 600B may includes the programmable degradation monitor 602, slow circuits 606, and fast circuits 608 which were previously described with reference to the integrated circuit 600A.

In one embodiment of the invention, power and ground are coupled into the integrated circuit 600B at its VCC and GND terminals respectively and provided to the circuitry therein. Power and ground are also coupled into the off chip bias voltage regulator/generator 604B to generate the P-body bias voltage for the P-body bias terminal PBBB 620 that is coupled to selected circuitry such as the p-channel transistors of the fast circuits 608. In another embodiment of the invention, power and ground are coupled into the off chip bias voltage regulator/generator 604B to generate the P-body bias voltage as well a regulated positive power supply that is coupled into the VCC terminal of the integrated circuit 600B.

Figure 7:
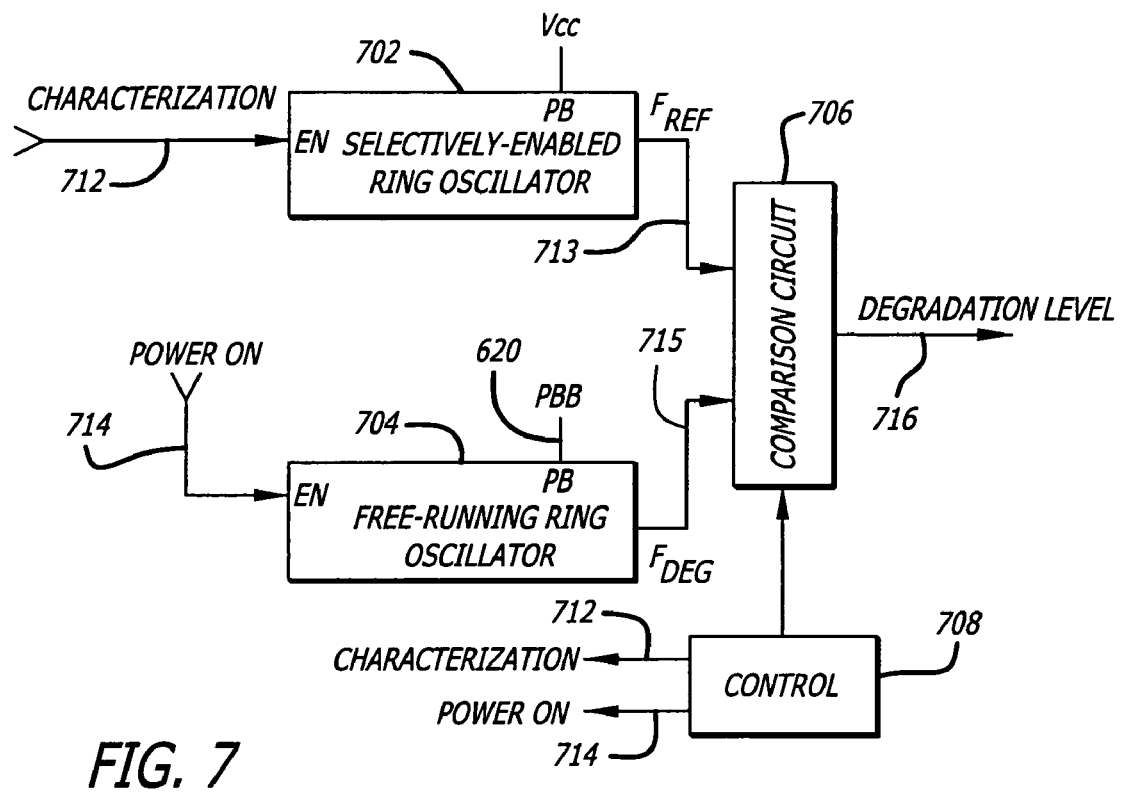
FIG. 7 is a functional block diagram of integrated on-chip functional blocks to provide transistor degradation monitoring.

Referring now to FIG. 7, a functional block diagram of on-chip characterization circuitry is illustrated. The on-chip characterization circuitry includes a selectively-enabled ring oscillator 702, a free-running ring oscillator 704, a comparison circuit 706, and a control circuit 708. Periodically, an integrated circuit may cause the on-chip characterization circuitry to measure transistor degradation. One or more degradation levels 716 may be generated by the comparison circuit 706.

The degradation levels 716 may be read out from the integrated circuit by a user system to adapt the user system to it in one embodiment of the invention. In another embodiment of the invention, the degradation levels 716 may be read out from the integrated circuit by a test or characterization system in order to obtain the degradation data and use it to better calibrate a model simulation of transistor degradation. In yet another embodiment of the invention, the degradation levels 716 may be used by the integrated circuit 100 internally in order to adapt to the aging or transistor degradation of its own transistors.

The selectively-enabled ring oscillator 702 and free-running ring oscillator 704 form a pair of ring oscillators (ROs) that may be used as a transistor degradation monitor to characterize transistor degradation. One or more pairs of ring oscillators (selectively-enabled ring oscillator 702 and free-running ring oscillator 704) may be used to characterize various types of transistor degradation.

The selectively-enabled ring oscillator 702 generates the reference frequency output $F_{REF}$ 713 which is coupled into the comparison circuit 706. The transistors in the selectively-enabled ring oscillator 702 are generally considered to be fresh. The free-running ring oscillator 704 generates a degraded frequency $F_{DEG}$ 715 which is coupled into the comparison circuit 706. The transistors in the selectively-enabled ring oscillator 702 are generally considered to be aged or degraded.

The free-running ring oscillator 704 and the selectively-enabled ring oscillator 702 have substantially similar circuits including transistors and interconnections. However, the p-body terminal of the p-channel transistors in the selectively-enabled ring oscillator 702 are coupled to VCC while the p-body terminal of some of the p-channel transistors in the free-running ring oscillator 704 are coupled to the P-body bias voltage PBB 620. This way, the effectiveness of the body bias compensation may be determined.

The free-running ring oscillator 704 and the selectively-enabled ring oscillator 702 may be positioned in the integrated circuit 100 in the same location to obtain a measure of transistor degradation in one location. A duplicate pair may be positioned in another location of the integrated circuit to obtain a measure of transistor degradation at a different location on the integrated circuit. Alternatively, another free-running ring oscillator 704 may be positioned at the different location and compared with the same selectively-enabled ring oscillator 702 to obtain a measure of transistor degradation at a different location.

As discussed previously, there are two significant transistor degradation mechanism that are known which affect circuit performance, PMOS BT transistor degradation and NMOS hot electron transistor degradation. Each transistor in the free-running ring oscillator 704 and the selectively-enabled ring oscillator 702 with rectangular shaped channels has a width and a length. Regardless of their size of width and length, the PFETs may experience PMOS BT transistor degradation. NFETs experience hot electron transistor degradation if they have short channels, where the length of their channels is relatively short.

In one embodiment on the invention, each transistor of the pair of the free-running ring oscillator 704 and the selectively-enabled ring oscillator 702 may be designed with a relatively short channel, such as less than two microns, one micron to one-tenth of a micron for example. In this case, the NFETs of the free-running ring oscillator 704 experience hot electron transistor degradation and the PFETs of the free-running ring oscillator 704 experience PMOS BT transistor degradation. In this manner, the pair of the free-running ring oscillator 704 and the selectively-enabled ring oscillator 702 can be used to measure the combination of PMOS BT transistor degradation and hot electron transistor degradation.

To avoid hot electron transistor degradation in the NFETs of the free-running ring oscillator 704, each NFET transistor of the pair of the free-running ring oscillator 704 and the selectively-enabled ring oscillator 702 pair can be designed with a relatively long channel, such as greater than two microns for example. In this manner, the pair of the free-running ring oscillator 704 and the selectively-enabled ring oscillator 702 can be used to measure PMOS BT transistor degradation alone without hot electron transistor degradation. The channel lengths of the PFET transistors may be similar to that of the NFET transistors and the widths of both PFET and NFET transistors may be altered accordingly to provide sufficient gain in each inverter to provide an oscillating output.

The free-running ring oscillator 704 operates continuously to generate an oscillating output when the integrated circuit 100 is powered on. A power on control signal 714 generated by the control circuit 708 is coupled into the enable input of the ring oscillator 704.

A characterization signal 712 is generated by the control circuit 708 and coupled into the enable input of the selectively-enabled ring oscillator 702. The selectively-enabled ring oscillator 702 is selectively powered on by the characterization signal 712 when it is desirable to measure transistor degradation. The selectively-enabled ring oscillator 702 acts as a reference ring oscillator to generate a reference ring oscillation signal $F_{REF}$ 713 as it experiences no degradation. The selectively enabled ring oscillator 702 includes transistors without transistor degradation in order to provide a comparison with the degraded transistors of the free-running ring oscillator 704.

Under control the control circuit 708, the comparison circuit 706 compares the reference frequency 713 with the degraded frequency 715 in order to determine a measure of degradation level 716. As the transistors within the free-running ring oscillator 704 degrade, it is expected that the degraded frequency output signal 715 will have a lower frequency in that of the reference frequency signal 713. Known methods of measuring the frequency of a ring oscillator may be used in the comparison circuit 706, such as that exemplified in U.S. Pat. No. 6,535,013 by Samie B. Samaan, filed Dec. 28, 2000. However, a different comparison circuit may also be used herein in order to provide a determination of transistor degradation and then compensate for such degradation.

Figure 8:
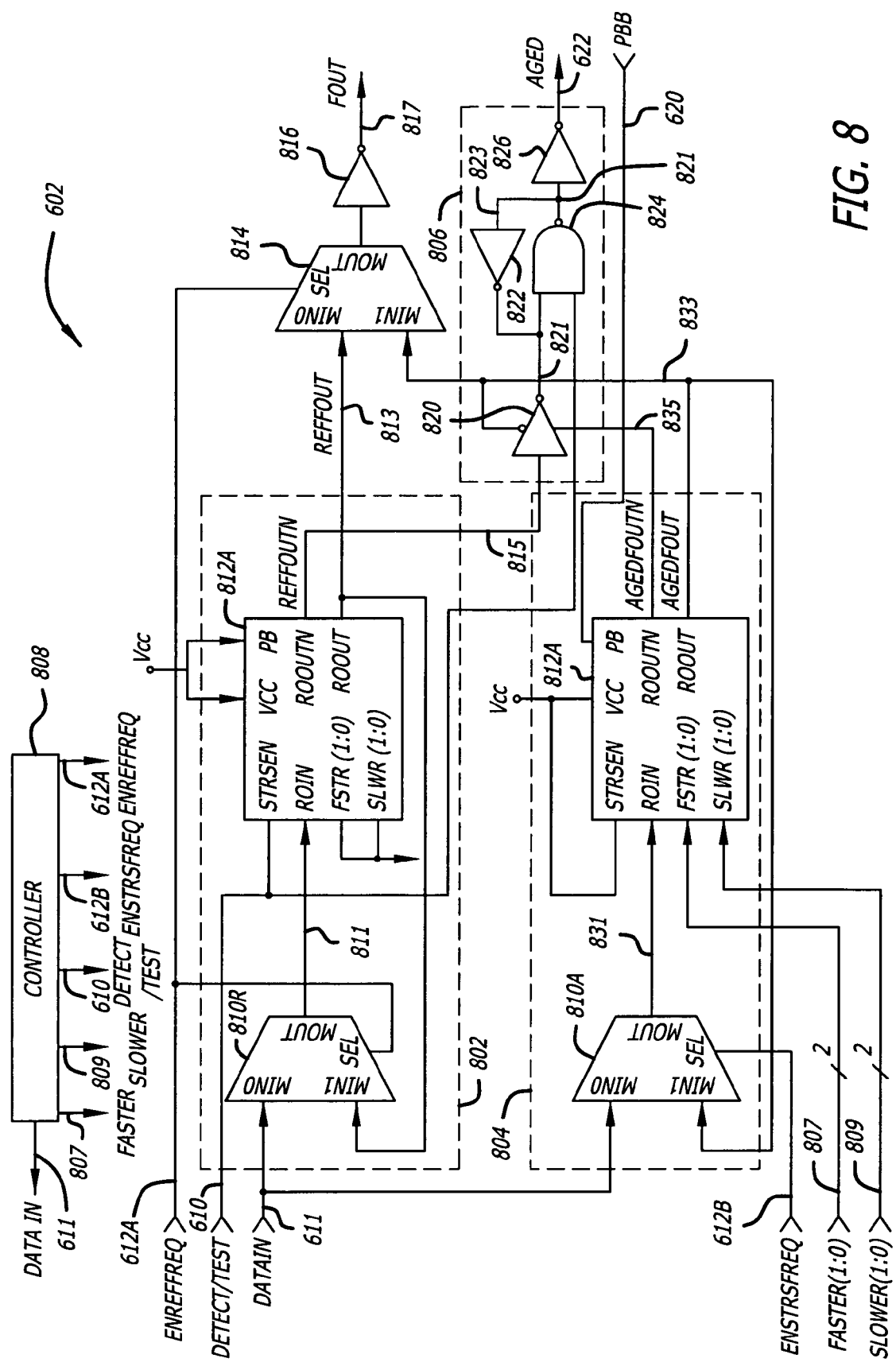
FIG. 8 is a functional block diagram of one embodiment of a programmable degradation monitor for the integrated circuits illustrated in FIGS. 6A-6B.

Referring now to FIG. 8, a block diagram of the programmable degradation monitor 602 is illustrated. The programmable degradation monitor 602 includes a reference ring oscillator 802, a degradation ring oscillator 804, a comparison circuit 806, and a controller 808 coupled together as shown to generate the aged detection signal 622. The programmable degradation monitor 602 may further include additional comparison circuitry to monitor the reference frequency and/or the aged frequency such as a multiplexer 814 and inverter 816 coupled together as shown in FIG. 8.

The reference ring oscillator 802 includes a transfer gate multiplexer 810R and a selectively enabled programmable delay stage 812R coupled together as shown. The degradation ring oscillator 804 includes the transfer gate multiplexer 810A coupled together with the selectively enabled programmable delay stage 812A as shown. The comparison circuit 806 includes a comparator consisting of a tri-state buffer 820 coupled together with a latch formed out of a NAND gate 824 and inverters 822 and 826 as shown in FIG. 8.

Each programmable delay stage 812R and 812A includes an odd number of inverters between their ring oscillator inputs (ROIN) and ring oscillator outputs (ROOUT) to set up a ring oscillator through the multiplexers 810A and 810R when the input is appropriately selected. Between the input ROIN and the output ROOUT in each programmable delay stage, there is an even number of inverters. In a ring oscillating mode, the output ROUT is coupled into the input ROIN of the programmable delay stage through the multiplexer. In an aged detection mode, the data input DATAIN 611 is coupled into the ROIN input of the programmable delay stage. Each of the programmable delay stages further includes a power terminal input VCC, a stress enable input STRSEN, a P-body input terminal PB, faster timing control inputs FSTR[1:0], and slower timing control inputs SLWR [1:0].

In the reference ring oscillator 802, the detect/test signal 610 is coupled into the stress enable pin of the programmable delay stage 812R. The multiplexer output MOUT 811 is coupled into the ring oscillator input of the programmable delay stage 812R. The P-body terminal PB is coupled to the positive power supply VCC as is the positive power supply terminal VCC. The faster and slower input terminals are coupled to ground. Thus, the timing of the programmable delay stage 812R is not altered by the faster or slower control signals. The ring oscillator output of the programmable delay stage 812R is coupled to the second input of the multiplexer 810R. The ring oscillator output is also coupled into the second input of the multiplexer 814 as the reference frequency output REFFOUT 813. The even ring oscillator output ROOUTN is coupled into a data input the tri-state buffer 820 as the REFFOUTN signal 815.

The multiplexers 810A,810R include a first multiplexer input MIN0 and a second multiplexer input MIN1 that are selectively coupled to the multiplexer output MOUT by the select control signal SEL. If the select control signal is a logical zero, the first multiplexer input MIN0 is coupled to the multiplexer output MOUT. If the select control signal SEL is a logical one, the second multiplexer input MIN1 is coupled to the multiplexer output MOUT. The first multiplexer input of each multiplexer is coupled to the data input DATAIN 611. The second multiplexer input of each multiplexer is respectively coupled to the ring oscillator output ROOUT of each programmable delay stage. The select input control signals SEL of the multiplexers 810R,814 are coupled to the reference frequency enable signal ENREF-FREQ 612A. The select input signal SEL of the multiplexer 810A is coupled to the enable stress frequency input signal 612B. Accordingly, if the enable reference frequency signal 612A is a logical one, the reference ring oscillator 802 generates the reference frequency output on REFFOUT which is selectively coupled through the multiplexer 814, inverted and driven out by inverter 816 onto the frequency output FOUT 817. If the enable reference frequency control signal 612A is a logical zero and the enable stress frequency control signal 612B is a logical one, the degradable ring oscillator 804 generates the aged frequency output on AGEDFOUT which is selectively coupled through the multiplexer 814, inverted and driven out by inverter 816 onto the frequency output FOUT 817.

In the degradable ring oscillator 804, the P-body terminal PB of programmable delay stage 812A is coupled to the P-body bias voltage 620 to compensate for aging of the p-channel transistors. The multiplexer output MOUT 831 is coupled into the ring oscillator input ROIN of the programmable delay stage 812A. The stress enable pin is coupled to the positive power supply VCC as is the positive power supply terminal VCC. The ring oscillator output of the programmable delay stage 812A is coupled to the second input MIN1 of the multiplexer 810A. The ring oscillator output ROOUT is also coupled into the first input MIN0 of the multiplexer 814 and the enable prime ENP of the tri-state buffer 820 as the aged frequency output AGEDFOUT 833. The even ring oscillator output ROOUTN is coupled into enable input EN of the tri-state buffer 820 as the AGED-FOUTN signal 835.

At multiplexer 810A, the enable stress frequency control signal 612B selects between the DATAIN and the AGED-FOUT signal 833 to be input into the programmable delay stage 812A. Either signal may be used to age and stress the degradable ring oscillator 804. If the enable stress frequency control signal 612B is a logical one, the degradable ring oscillator 804 functions in a ring oscillating mode to stress and age the transistors therein. Alternatively if the enable stress frequency control signal 612B is a logical one, a data toggling mode/age detection mode, a signal on the data input DATAIN 611 may be used to stress and age the transistors in the degradable ring oscillator 804. The data input DATAIN may be a stress pattern of ones and zeroes causing the inverters to continuously change from one logic state to another. For example, the data input DATAIN may couple to a clock terminal and the stress pattern may be a clock signal. As another example, the data input DATAIN may couple to a logic node internally within an integrated circuit and the stress pattern may be an actual data pattern. In this manner, the degradable ring oscillator 804 may experience the same switching frequency at an actual node of a functional circuit and receive substantially similar AC stress.

The faster and slower input terminals of the programmable delay stage 812A are respectively coupled to the faster control signals FASTER [1:0] 807 and the slower control signals SLOWER[1:0] 809. Thus, the timing of the programmable delay stage 812A may be altered by the faster or slower control signals. This may be desirable during the initial factory testing when circuits are new and fresh to compensate for process variations that cause a difference in the initial delays between the reference ring oscillator 802 and the degradable ring oscillator 804. That is when the circuitry is fresh, the faster or slower control signals may be used to vary the delay provided by the inverters in the delay stage 812A and zero out input skew into the comparison circuitry 806 so that the aged signal 622 will stay at logical zero, indicating a fresh circuit. The faster control signals allow the delay provided by the inverters in the delay stage 812A to be reduced so that the aged signal 622 does not always stay a logical one value, constantly indicating an aged circuit.

The controller 808 can generate the control signals to control the ring oscillators 802,804, the comparison circuitry 806, and select the oscillating frequency (REFFOUT or AGEDFOUT) that is output from the programmable degradation monitor 602. The controller 808 generates the data input signal 611, the faster control signals 807, the slower control signals 809, the detect/test signal 610, the enable stress frequency signal 612B, and the enable reference frequency signal 612A. The controller 808 maybe a part of the programmable degradation monitor 602 or a part of the integrated circuit external thereto.

If no testing or age detection is to be performed, the detect/test signal 610 is a logical zero causing the NAND gate 824 and inverter 622 to drive the aged output signal 622 to a logical zero. The input of inverter 822 is coupled to the output of the NAND gate 824 such that when node 823 is a logical high, node 821 is driven to a logical zero to initialize the comparison circuitry. When age detection is to be performed, the detect/test signal 610 is a logical one enabling the NAND gate 824 and inverter 622 to capture and latch a change in state on node 821 from a logical zero to a logical one indicating that the degradable ring oscillator 804 has aged over that of the reference ring oscillator 802. In order to do so, the tri-state driver 820 is stronger to overdrive the weaker inverter 822 and change the state of node 821.

In order to perform age detection, the detect/test signal 610 is set to a logical one, the enable reference frequency ENREFFREQ 612A is set to a logical zero, the enable stress frequency ENSTRSFREQ 612B is set to a logical zero, and a data signal is provided on the data input DATAIN 611. The data signal propagates equally through the multiplexers 810A,810R and into the ring oscillator inputs ROIN of each of the programmable delay stages 812A,812R respectively. If the programmable delay stage 812A has not aged, the delay of the data signal to the ring oscillator output ROOUT should be similar to the delay in the programmable delay stage 812R. If the programmable delay stage 812A of the degradable ring oscillator has aged, the delay of the data signal to the ring oscillator output ROOUT should be greater than the delay in the programmable delay stage 812R of the reference ring oscillator. That is when aged, the data input signal will reach the aged output signals AGEDFOUT 835 and AGEDFOUTN 833 generated by the degradable ring oscillator 804 at a later time than the reference output signal REFFOUTN 815 generated by the reference ring oscillator 802.

The aged output signals AGEDFOUT 835 and AGED-FOUTN 833 generated by the degradable ring oscillator 804 enable and disable the tri-state driver 820. Coincidentally, the reference output signal REFFOUTN 815 generated by the reference ring oscillator 802 races against the AGED-FOUT 835 and AGEDFOUTN 833 signals to try and drive out a data signal through the tri-state driver 820.

If there is no aging in the degradable ring oscillator, the data input signal DATAIN should reach the aged output signals AGEDFOUT 835 and AGEDFOUTN 833 and the reference output signal REFFOUTN 815 at nearly the same time. Thus with no aging, the tri-state driver 820 may be disabled by the output signals AGEDFOUT 835 and AGED-FOUTN 833 before the reference output signal REFFOUTN 815 can change the output state of the tri-state driver.

On the other hand with some aging in the degradable ring oscillator, the data input signal DATAIN may change the state of the reference output signal REFFOUTN 815 before reaching the aged output signals AGEDFOUT 835 and AGEDFOUTN 833. This difference in delay from the aged circuitry can cause a change in the logical state of node 821 while the tri-state driver 820 is enabled, before the aged output signals AGEDFOUT 835 and AGEDFOUTN 833 can disable the tri-state driver 820. With node 821 being driven from a logical zero to a logical one, the aged signal 622 is driven to a logical one to indicate that aged circuitry has been detected.

As discussed previously, the aged signal 622 is coupled into the body bias voltage generator to compensate for the transistor degradation that is detected. This P-body bias compensation is fed back and coupled into the degradable oscillator 804 into the programmable delay stage 812A. In this case, another test for age detection can be made in order to determine if the P-body bias compensation provided by the body bias voltage generator/regulator is sufficient to overcome the transistor degradation or if further compensation is needed. If the delay through ring oscillators 802, 804 is similar with the change in the body bias compensation, indicating that the compensation is sufficient, the aged signal 622 should remain low. If the delay through ring oscillators 802,804 is different with the change in the body bias compensation, indicating that the compensation is insufficient, the aged signal 622 should change state and once again indicate aged circuitry. In this case, the body bias voltage generator can further alter the P-body bias compensation in incremental steps until reaching a sufficient amount to compensate for the aging or a maximum amount of compensation. In either case, the compensation can improve the overall performance of the fast circuitry.

Figure 9:
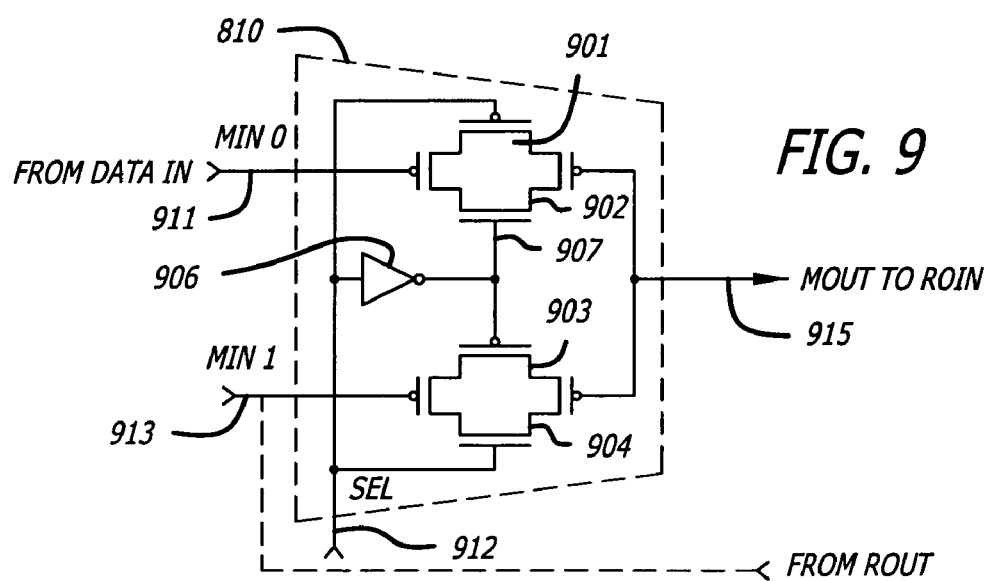
FIG. 9 is a transistor schematic diagram of an embodiment of a transfer gate multiplexer.

Referring now to FIG. 9, a transistor schematic diagram of a transfer gate multiplexer 810 is illustrated. The multiplexer 810 includes a pair of CMOS fully complimentary transfer gates. One CMOS fully complimentary transfer gate is formed by the n-channel transistor 902 and the p-channel transistor 901 coupled in parallel together. The other CMOS fully complimentary transfer gate is formed by the p-channel transistor 903 and the n-channel transistor 904 coupled in parallel together. The body terminals of the p-channel transistors are traditionally coupled to the source terminal. The transfer gate multiplexer can provide a more equal delay between inputs and the output for the rise and fall of the data input signal DATAIN. Otherwise, logic gates may be used to form the multiplexers 810A,810R.

The multiplexer 810 has a first data input MIN0 911 and a second data input MIN1 915. The multiplexer 810 further has a select control input 912 and a multiplexer output MOUT 915. The first data input 911 is coupled into the source or drain of the transistors 901 and 902 while the multiplexer output 915 is coupled to the drain or source of the transistors 901 and 902. The second data input 913 is coupled to the source or drain of the p-channel transistor 903 and the n-channel transistor 904 while the multiplexer output 915 is coupled to the drain or source of the p-channel transistor 903 and the n-channel transistor 904.

The select control input 912 is coupled to the gates of the n-channel transistor 904 and the p-channel transistor 901. The select control input 912 is also coupled into the input of inverter 906. The inverter 906 inverts the select control signal at it's output 907 which is then coupled into the gates of the n-channel transistor 902 and the p-channel transistor 903. When the select When the select control signal 912 is a logical zero, the p-channel transistor 901 and the n-channel transistor 902 are turned on such that the first data input 911 is coupled to the multiplexer output 915. When the select control signal 912 is a logical one, the n-channel transistor 904 and the p-channel transistor 903 are turned on such that the second data input 913 is coupled to the multiplexer data output 915. In this manner, the select control signal can selectively couple either the first data input or the second data input to the multiplexer data output.

As illustrated in FIG. 9, the multiplexer output 915 is coupled to the ring oscillator input ROIN of the respective programmable delay stage. The first data input 911 is coupled to the data input signal 611. The second data input 913 is coupled to the ring oscillator output ROUT from the respective programmable delay stage. The select control terminal is coupled to either the enable reference frequency signal 612A or the enable stress frequency signal 612B.

Figure 10:
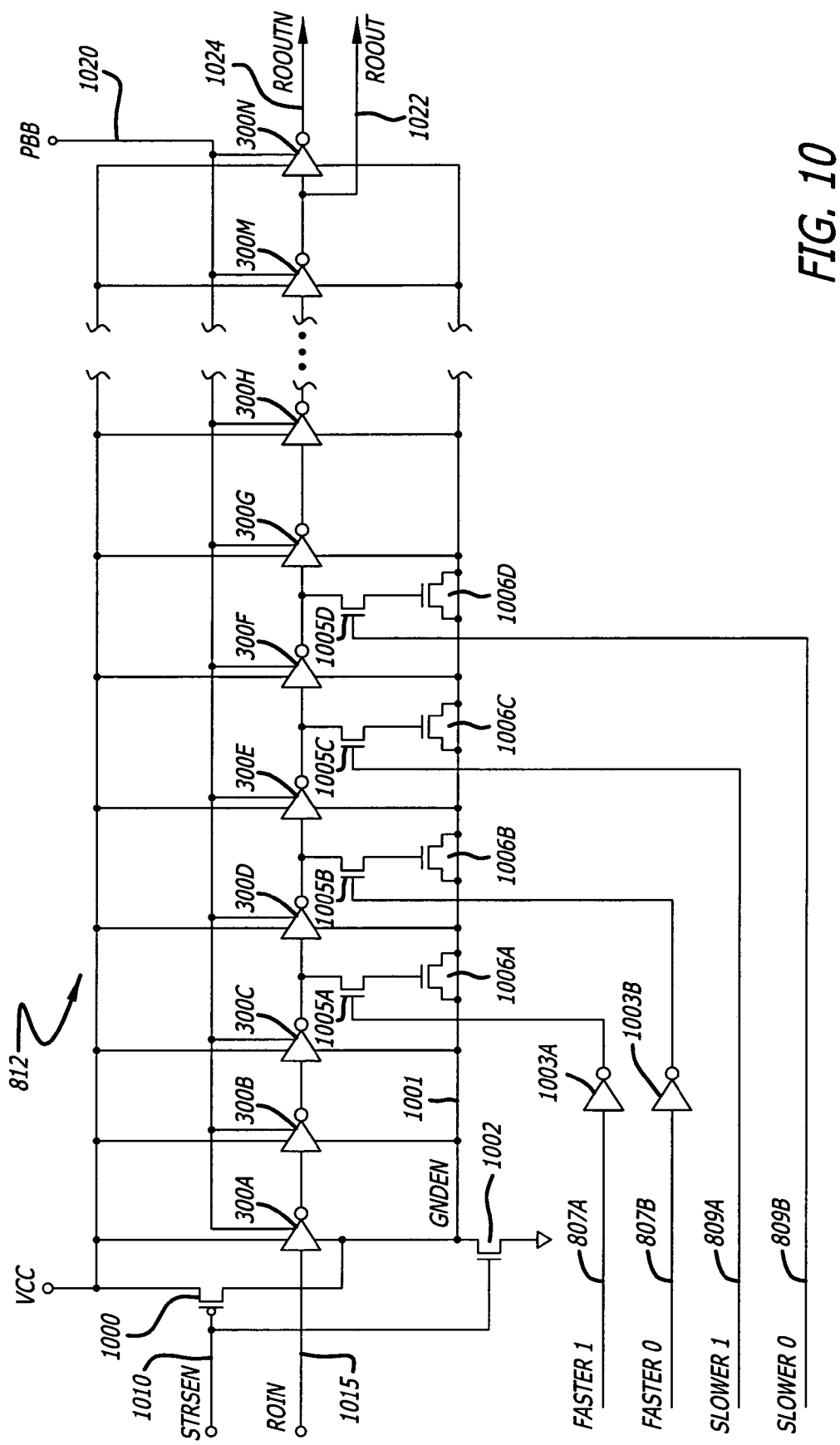
FIG. 10 is a transistor schematic diagram of an embodiment of a selectively enabled programmable delay stage.

Referring now to FIG. 10, a selectively enabled programmable delay stage 812 is illustrated. The programmable delay stage 812 illustrated in FIG. 10, maybe used as the programmable delay stages 812R, 812A illustrated in FIG. 8.

The programmable delay stage 812 includes inverters 300A-300N, p-channel transistor 1000, n-channel transistor 1002, inverters 1003A-1003B, n-channel transistors 1005A-1005D, and n-channel transistors 1006A-1006D coupled together as shown. As illustrated in FIG. 3 and FIG. 5A, the inverters 300A-300N include the P-body terminal PB coupled to the P-body bias terminal PBB 1020. The stress enable signal STRSEN 1010 is coupled to the gates of the p-channel transistor 1000 and the n-channel transistor 1002.

The ring oscillator input ROIN 1015 is coupled into the input of the first inverter 300A. Inverters 300A-300N are coupled in series together in a daisy chain. The ring oscillator output ROUT 1022 experiences an odd number of inversions from the ring oscillator input ROIN 1015. The even ring oscillator output ROOUTN 1024 experiences an even number of inversions from the ring oscillator input ROIN 1015. Note that more or less p-channel and n-channel transistors may be paired together and used to form N inverters, where N is an odd number.

Inverters 300A-300N are coupled to a ground enable node GNDEN 1001. Logically, the ground enable node GNDEN 1001 enables and disables the negative power supply or ground from being coupled to the inverter chain 330A-330N. When the programmable delay stage is enabled, an AC waveform may be generated at ROOUT 304 when in a ring oscillating mode. Alternatively a delayed inverted waveform may be generated at ROOUT 304 from that at the ring oscillator input ROIN when enabled in an aged detection mode. When the programmable delay stage is disabled, the output ROOUT and ROOUTN may float to VDD while node 1001 is tied to VDD.

The p-channel transistor 1000 and the n-channel transistor 1002 selectively enable the programmable delay stage 812. The n-channel transistor 1002 selectively gates the negative power supply or ground to the ground enable node GNDEN 1001 thereby enabling the programmable delay stage in response to the stress enable signal 1010 being a logical one. The p-channel transistor 1000 selectively gates the positive power supply VCC to the ground enable node 1001 in response to the stress enable signal 10010 being a logical zero thereby disabling the programmable delay stage.

As illustrated in FIG. 8, the stress enable input to the programmable delay stage 812A is coupled to the positive power supply VCC such that the programmable delay stage is always enabled and aged when power is provided.

To program the timing of the programmable delay stage 812, the faster control signals 807A-807B and the slower control signals 809A-809B are provided. The faster and slower control signals determine whether the capacitive loading at the gates of the transistors 1006A-1006D are respectively coupled to the nodes between the inverters.

The faster control signals 807A-807B are respectively coupled into the inputs of the inverters 1003A-1003. The outputs of the inverters 1003A-1003B are respectively coupled to the gates of the n-channel transistors 1005A-1005B. The n-channel transistors 1005A-1005B are turned off in response to the faster control signals being a logical one, such that the capacitive loading is not applied to the nodes between the inverters. This can speed up the delay path in the programmable delay stage 812 between ROIN 1015 and ROOUT 1022,ROOUTN 1024.

The slower control signals 809A-809B are respectively coupled to the gates of the n-channel transistors 1005C-1005D. The n-channel transistors 1005C-1005D are turned on in response to the slower control signals being a logical one such that the capacitive loading of the gates of the n-channel transistors 1006C-1006D is applied to the respective nodes between the inverters. This can slow down the delay path in the programmable delay stage 812 between ROIN 1015 and ROOUT 1022,ROOUTN 1024.

As illustrated in FIG. 8, the faster and slower control signals are coupled to ground such that they are not used to control the timing of the delay path in the programmable delay stage 812R.

Figure 11A:
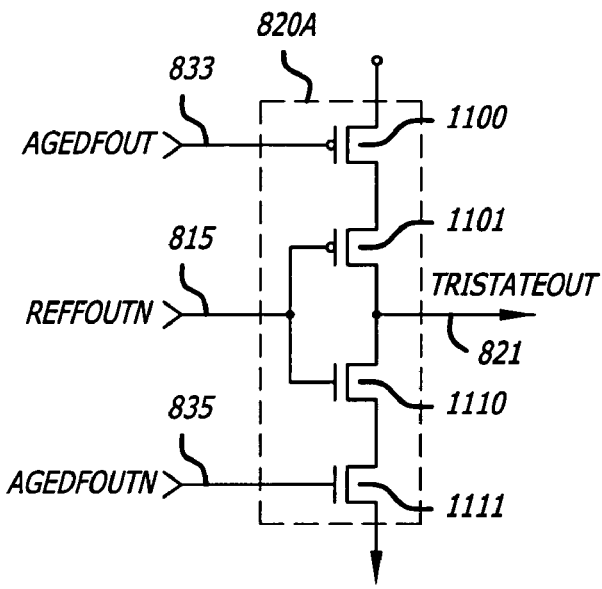
FIGS. 11A-11B are transistor schematic diagrams of embodiments of a tri-state buffer.

Referring now to FIG. 11A, a transistor schematic diagram of a tri-state buffer 820A is illustrated. The tri-state buffer 820A includes p-channel transistors 1100-1101 and n-channel transistors 1110-1111 coupled together as shown. The AGEDFOUT control signal 833 is coupled to the gate of the p-channel transistor 1100. The AGEDFOUTN control signal 835 is coupled to the gate of the n-channel transistor 1111. The gates of the p-channel transistor 1101 and the n-channel transistor 1110 are coupled to the REFFOUTN signal 815.

When the AGEDFOUT control signal 833 is a logical zero and the AGEDFOUTN control signal 835 is a logical one, the tri-state buffer 820A is enabled. Conversely when the AGEDFOUT control signal 833 is a logical one and the AGEDFOUTN control signal 835 is a logical zero, the tri-state buffer 820 is disabled. Receiving data on the REFOUTN 815, the tri-state buffer 820A drives inverted data onto the tri-state output node TRISTATOUT 821.

Figure 11B:
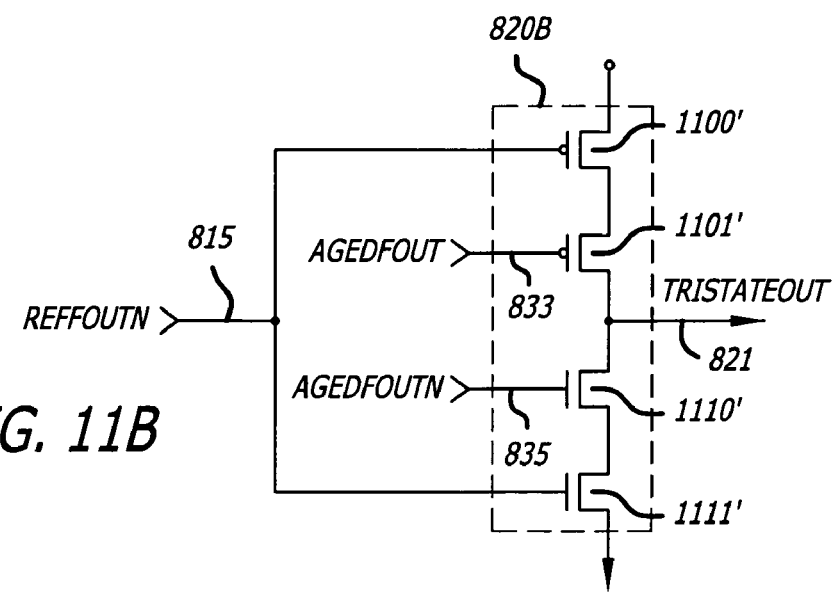

Referring now to FIG. 11B, a transistor schematic diagram of a tri-state buffer 820B is illustrated. The tri-state buffer 820B alters input signal coupling to the transistors in comparison with the tri-state buffer 802A. The tri-state buffer 820A includes p-channel transistors 1100'-1101' and n-channel transistors 1110'-1111' coupled together as shown. The AGEDFOUT control signal 833 is coupled to the gate of the p-channel transistor 1101'. The AGEDFOUTN control signal 835 is coupled to the gate of the n-channel transistor 1110'. The gates of the p-channel transistor 1100' and the n-channel transistor 1111' are coupled to the REFFOUTN signal 815. Otherwise, the tri-state buffer 820B is similarly drives data out and is similarly enable and disabled in comparison with the tri-state buffer 820A.

As discussed previously, the AGEDFOUTN control signal 835 and the AGEDFOUT control signal 833 race the REFFOUTN signal 815 to disable the tri-state buffer before it changes state to perform a comparison between the delay paths in the ring oscillators and detect aged transistors.

Referring now to FIG. 12, waveform diagram illustrates the functionality of the programmable degradation monitor 812 when in a fresh or new state. Waveforms 1210, 1211, 1215, 1222, 1233, and 1235 respectively represent signals on the detect/test control input 610, the data input DATAIN 611, the aged detection output AGED 622, the even reference frequency output REFFOUTN 815, the aged frequency output AGEDFOUT 833, and the even aged frequency output AGEDFOUTN 835. As the degradation ring oscillator 804 is fresh or new, it is expected that no aging will be detected such that the aged detection signal AGED 622 will remain at a logic zero level as is illustrated by waveform 1222.

As discussed previously, the AGED output signal 622 is reset or initialized to a logical zero by means of the detect signal 610. The detect/test signal 610 transitions to a logical one in order to enable age detection as illustrated in waveform 1210. A square wave is provided by the controller 808 on the data input DATAIN as illustrated by waveform 1211. The enable reference frequency control signal and the enable stress frequency control signal are set to logic zero levels by the controller so that the data input waveform 1211 can propagate through each ring oscillator 802,804 to the respective outputs REFFOUTN 815, and AGEDFOUT 835, AGEDFOUTN 833 and to the tri-state driver 820.

As there is no aging, the waveforms of the respective outputs REFFOUTN 815, and AGEDFOUT 835, AGEDFOUTN 833 reach the tri-state driver 820 at substantially the same time as illustrated by waveform 1215 and waveforms 1233,1235 respectively. Thus, the tri-state driver 820 is disabled by the waveforms 1233,1235 before the waveform 815 can change its output state and change the state of the aged detect output signal AGED 622 as illustrated by waveform 1222.

After a period of time, the circuitry of the integrated circuits age and can reduce the overall performance there of. In which case, is desirable to detect the aging and compensate to recover the lost performance of the integrated circuitry.

Referring now to FIG. 13, waveform diagrams illustrate the functionality of the programmable degradation monitor when in an aged state. Waveforms 1210, 1211, 1215, 1322, 1333, and 1335 respectively represent signals on the detect/test control input 610, the data input DATAIN 611, the aged detection output AGED 622, the even reference frequency output REFFOUTN 815, the aged frequency output AGEDFOUT 833, and the even aged frequency output AGEDFOUTN 835. There is no change in waveforms 1210, 1211, and 1215 from that shown in FIG. 12. However, as the degradation ring oscillator 804 is now aged, it is expected that aging will be detected and that the aged detection signal AGED 622 will change state as illustrated by waveform 1322.

The AGED output signal 622 is reset or initialized to a logical zero by means of the detect signal 610. The detect/test signal 610 transitions to a logical one in order to enable age detection as illustrated in waveform 1210. A square wave is provided by the controller 808 on the data input DATAIN as illustrated by waveform 1211. The enable reference frequency control signal and the enable stress frequency control signal are set to logic zero levels by the controller so that the data input waveform 1211 can propagate through each ring oscillator 802,804 to the respective outputs REFFOUTN 815, and AGEDFOUT 835, AGEDFOUTN 833 and to the tri-state driver 820.

Instead of reaching the tri-state driver at the same time, the waveforms 1335, 1333 of AGEDFOUT 835, AGEDFOUTN 833 lag behind the waveform 1215 of REFFOUTN 815. The waveform 1215 on REFFOUTN 815 reaches the tri-state driver 820 before the waveforms 1335,1333 can disable the tri-state driver. Thus, the waveform 1215 on REFFOUTN 815 changes the state of the aged detection signal AGED 622 as is illustrated by waveform 1322. As discussed previously, the aged detection signal AGED is coupled into the body bias generator in order to incrementally compensate for the aging and the lost performance.

Figure 14:
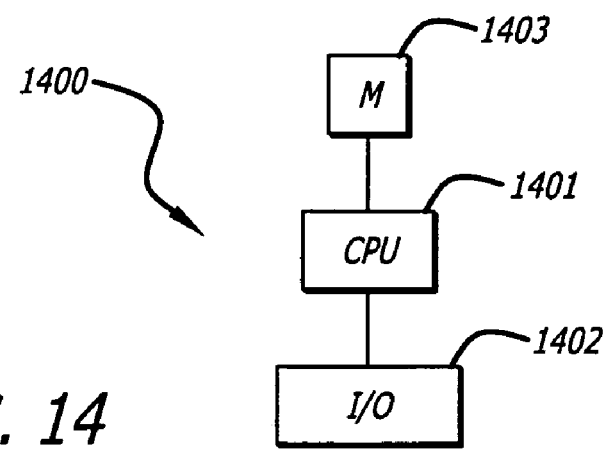
FIG. 14 is a block diagram of a typical computer system in which embodiments of the invention may be utilized.

Referring now to FIG. 14, a block diagram of a typical computer 1400 in which the embodiments of the invention may be utilized is illustrated. The computer 1400 includes a central processing unit (CPU) 1401, input/output devices (I/O) 1402 such as keyboard, modem, printer, external storage devices and the like and monitoring devices (M) 1403 such as a CRT or graphics display. The monitoring devices (M) 1403 provide computer information in a human intelligible format such as visual or audio formats.

Figure 15:
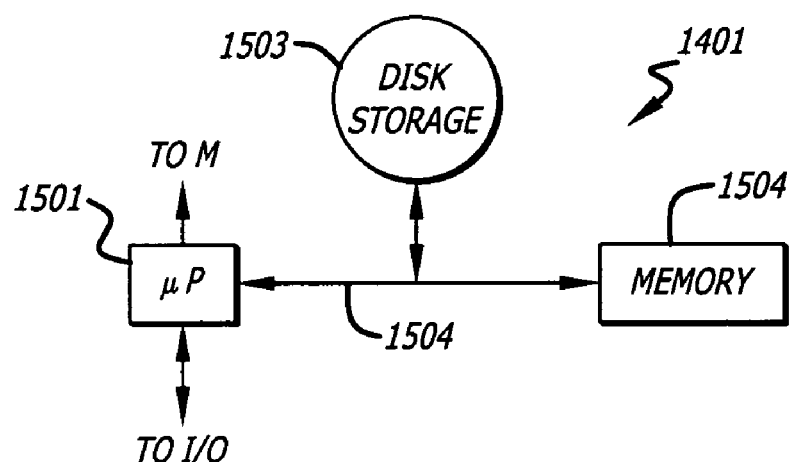
FIG. 15 is a block diagram of a central processing unit in which embodiments of the invention may be utilized.

Referring now to FIG. 15, a block diagram of a typical central processing unit 1401 in which the embodiments of the invention may be utilized is illustrated. The central processing unit 1401 includes a microprocessor 1501 including the embodiments of the invention, a disk storage device 1503, and a memory 1504 for storing program instructions coupled together. Disk storage device 1503 may be a floppy disk, zip disk, DVD disk, hard disk, rewritable optical disk, flash memory or other non-volatile storage device. The microprocessor 1501 and the disk storage device 1503 can both read and write information into memory 1504 over the memory bus 1504. Memory 1504 is typically dynamic random access memory (DRAM) but may be other types of rewritable storage.

The microprocessor 1501 is the integrated circuit 600A in one embodiment of the invention as illustrated in FIG. 6A including the on-chip programmable degradation monitor 602 and the bias voltage generator/regulator 604A. In another embodiment of the invention, the microprocessor 1501 is the integrated circuit 600B as illustrated in FIG. 6A, including the on-chip programmable degradation monitor 602, coupled to an off-chip bias voltage generator/regulator 604B. In either case, the one or more of the fast circuits 608 and/or slow circuits 606 may be part of an execution unit to execute one or more instructions of the microprocessor. The one or more instructions may be from a software program for example.

The embodiments of the invention can provide an integrated on-chip monitoring of transistor degradation with compensation to maintain the performance of circuits in integrated circuit chips.

While inverters coupled in series together in a daisy chain have been disclosed to provide an odd number of inversions of the ring oscillator, it is understood that any other inverting logic gate may be used, such as NOR gates and/or NAND gates with a switched power supply terminal. An inverting logic gate is a logic gate that receives a logical input signal and inverts it when generating a logical output signal. That is, inverters 300A-300N may be a combination of inverters, NAND gates, and NOR gates with the respective transistors being added to provide such gating. Additionally, the inverting logic gates may be coupled together into a series circuit and non-inverting logic gates may be interleaved between pairs of inverting logic gates. A non-inverting logic gate is a logic gate that receives a logical input signal and does not invert it when generating a logical output signal. Examples of non-inverting logic gates include a pass gate or transfer gate, an AND gate, an OR gate, and a buffer. With interleaved non-inverting logic gates included in the series circuit of inverting logic gates, the series circuit can be used to more closely resemble a data path.

While certain exemplary embodiments of the invention have been described and shown in the accompanying drawings, it is to be understood that such embodiments of the invention are merely illustrative of and not restrictive on the broad invention, and that this invention not be limited to the specific constructions and arrangements shown and described, since various other modifications may occur to those ordinarily skilled in the art.

What is claimed is:

1. A method in an integrated circuit comprising:
applying a data signal to a first ring oscillator and a second ring oscillator;
comparing a first delay in the data signal in the first ring oscillator with a second delay in the data signal in the second ring oscillator to detect transistor degradation; and
adjusting a body bias to transistors in the integrated circuit to compensate for transistor degradation in response to the comparing detecting transistor degradation.

2. The method of claim 1 further comprising:
prior to applying the data signal, enabling the first ring oscillator to age transistors therein.

3. The method of claim 1, wherein
the first ring oscillator and the second ring oscillator have substantially similar circuits.

4. The method of claim 1, wherein
the second ring oscillator has degraded transistors; and
the first ring oscillator has transistors without degradation.

5. The method of claim 1, wherein
the comparing determines the second delay is greater than the first delay to detect transistor degradation.

6. The method of claim 1, wherein
the comparing determines the second delay is substantially equal to the first delay and detects no transistor degradation.

* * * * *